United States Patent
Deeben et al.

(10) Patent No.: US 9,590,146 B2
(45) Date of Patent: Mar. 7, 2017

(54) METHOD FOR FABRICATION OF A LUMINESCENT STRUCTURE

(71) Applicant: KONINKLIJKE PHILIPS N.V., Eindhoven (NL)

(72) Inventors: Josephus Paulus Augustinus Deeben, Eindhoven (NL); Patrick Henricus Johannes Van Stijn, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/132,021

(22) Filed: Apr. 18, 2016

(65) Prior Publication Data

US 2016/0233392 A1    Aug. 11, 2016

Related U.S. Application Data

(62) Division of application No. 14/385,510, filed as application No. PCT/IB2013/052549 on Mar. 29, 2013, now Pat. No. 9,343,613.

(Continued)

(51) Int. Cl.
*H01L 33/00* (2010.01)
*H01L 33/50* (2010.01)

(52) U.S. Cl.
CPC .......... *H01L 33/502* (2013.01); *H01L 33/005* (2013.01); *H01L 33/501* (2013.01);
(Continued)

(58) Field of Classification Search
CPC ..... H01L 33/00; H01L 33/005; H01L 33/501; C04B 35/624; C04B 25/62635; C04B 35/62635; B82Y 30/00
See application file for complete search history.

(56) References Cited

U.S. PATENT DOCUMENTS 8,680,544 B2    3/2014  Wang
2006/0202105 A1*  9/2006  Krames ................. B82Y 30/00
250/208.1

(Continued)

FOREIGN PATENT DOCUMENTS

WO    2006097876 A1    9/2006

OTHER PUBLICATIONS

EPO as ISA, International Search Report and Written Opinion mailed Aug. 29, 2013 from PCT/IB2013/052549 filed Mar. 29, 2013.

*Primary Examiner* — Phuc Dang
(74) *Attorney, Agent, or Firm* — Patent Law Group LLP; Brian D. Ogonowsky

(57) ABSTRACT

A method for fabricating an LED/phosphor structure is described where an array of blue light emitting diode (LED) dies are mounted on a submount wafer. A phosphor powder is mixed with an organic polymer binder, such as an acrylate or nitrocellulose. The liquid or paste mixture is then deposited over the LED dies or other substrate as a substantially uniform layer. The organic binder is then removed by being burned away in air, or being subject to an $O_2$ plasma process, or dissolved, leaving a porous layer of phosphor grains sintered together. The porous phosphor layer is impregnated with a sol-gel (e.g., a sol-gel of TEOS or MTMS) or liquid glass (e.g., sodium silicate or potassium silicate), also known as water glass, which saturates the porous structure. The structure is then heated to cure the inorganic glass binder, leaving a robust glass binder that resists yellowing, among other desirable properties.

10 Claims, 4 Drawing Sheets

Related U.S. Application Data

(60) Provisional application No. 61/617,076, filed on Mar. 29, 2012.

(52) U.S. Cl.
CPC .............. *H01L 2224/16225* (2013.01); *H01L 2924/181* (2013.01); *H01L 2933/0041* (2013.01)

(56) References Cited

U.S. PATENT DOCUMENTS

| | | |
|---|---|---|
| 2006/0255716 A1 | 11/2006 | Tsutsumi et al. |
| 2008/0029780 A1 | 2/2008 | Ohtsuka et al. |
| 2008/0035887 A1* | 2/2008 | Iwao ................. C03C 3/068 252/301.4 F |
| 2010/0065864 A1 | 3/2010 | Kessels et al. |
| 2010/0264809 A1 | 10/2010 | Winkler et al. |
| 2011/0031516 A1 | 2/2011 | Basin |
| 2011/0266569 A1 | 11/2011 | Basin |
| 2012/0086028 A1* | 4/2012 | Beeson ................ H01L 33/501 257/98 |
| 2012/0200218 A1 | 8/2012 | Maemura et al. |

\* cited by examiner

METHOD FOR FABRICATION OF A LUMINESCENT STRUCTURE

CROSS-REFERENCE TO RELATED APPLICATIONS

The present application is a continuation of U.S. patent application Ser. No. 14/385,510 filed on Sep. 16, 2014, titled "Phosphor in Inorganic Binder for LED Applications", which is a §371 application of International Application No. PCT/IB2013/052549 filed on Mar. 29, 2013, which claims priority to U.S. Provisional Patent Application No. 61/617,076, filed Mar. 29, 2012. Ser. No. 14/385,510, PCT/IB2013/052549, and 61/617,076 are incorporated herein.

FIELD OF THE INVENTION

This invention relates to a phosphor layer for use with light emitting diodes (LEDs) to wavelength convert the LED emission and, in particular, to a technique for forming the phosphor layer with an inorganic glass binder for improved performance.

BACKGROUND

Providing a phosphor layer over an LED is common. Typically, a phosphor is provided over a blue LED to make white light. Blue light leaking through the phosphor, combined with the phosphor light, produces white light. There are many ways to provide the phosphor layer over the LED, and one prior art technique is described below.

It is known to pre-form a layer of phosphor powder mixed with silicone and then laminate the layer over blue-emission LED dies mounted on a submount wafer. The wafer is then singulated. The resulting dies emit white light. This is described in United States patent application publications 20110031516 and 20110266569, by Grigoriy Basin et al., assigned to the present assignee and incorporated by reference. Other techniques also mix the phosphor powder in an organic polymer binder (e.g., silicone or epoxy) and then deposit (e.g., print, mold, etc.) the liquid/paste layer directly over the LEDs. The binder is then cured to harden it.

However, the heat and high flux from the LEDs tend to oxidize the organic binder surrounding the phosphor particles, causing the binder to yellow and color shift the light. Further, high quality silicone and epoxy are relatively expensive, which is a significant concern for large remote phosphor components.

What is needed in a process for forming a phosphor layer that can be either formed directly over LEDs or formed on a transparent substrate and which does not use silicone or other organic polymer as a binder.

Although inorganic glass would be a relatively stable and reliable binder for the phosphor powder, molten glass is too chemically reactive at the high temperatures needed to form a phosphor-glass layer, since the glass would react chemically with the phosphors, especially red nitride phosphors.

A sol-gel for forming a glass layer may also be considered as a candidate to substitute for the silicone, but the sol-gel is also too reactive for the phosphor, leading to light attenuation. Further, the low viscosity of sol-gel would result in phosphor sedimentation and non-uniform phosphor density. Other problems would exist as well.

SUMMARY

A phosphor layer is formed, having an inorganic glass binder, that can be used as a remote phosphor for LEDs or as a coating over LEDs to wavelength-convert the LED light. In one embodiment, the LED emits blue light, and the phosphor converts the light to white light.

Initially, phosphor powder is mixed with an organic polymer binder, such as inexpensive acrylate or nitrocellulose. The mixture may be formed as a paste having a wide range of viscosities. Such a mixture is then easily screen printed over a transparent substrate, such as a thin glass substrate. Alternatively, the mixture can be screen printed over LED dies mounted on a submount wafer. Other deposition techniques may be used. The layer may be made to have an accurate thickness, such as +/−2%.

The organic binder is then burned away in air, such as at 180-300 degrees C. Alternatively, the mixture may be subject to an O2 plasma process. In either case, the polymer is oxidized and evaporates. The binder may also be chemically dissolved.

The resulting layer is a porous, sintered phosphor powder layer that is substantially uniformly distributed over the transparent substrate or LEDs. The porous layer is relatively weak and subject to contamination.

Next, the porous layer is impregnated with a sol-gel (e.g., a sol-gel of TEOS or MTMS) or liquid glass (e.g., sodium silicate or potassium silicate), also known as water glass, which saturates the porous structure.

The structure is then heated to cure the inorganic glass binder. In the case of sol-gel, the heating causes the sol-gel to become cross-linked to create a hard, scratch resistant glass layer. In the case of liquid glass, the water component evaporates, leaving a hard layer. Other glassy materials may be used.

The resulting inorganic binder material is extremely stable under the high heat and flux generated by the LEDs, it resists yellowing, it conducts heat much better than silicone or epoxy, it is much less expensive than silicone or epoxy, and it has greater mechanical strength and scratch resistance.

Other embodiments are disclosed.

BRIEF DESCRIPTION OF THE DRAWINGS

Elements that are the same or similar are labeled with the same numeral.

DETAILED DESCRIPTION

Although the present invention of a phosphor layer does not rely on its use with any particular LED, an example of an LED structure will be described to illustrate the phosphor layer's use with an LED.

Figure 1:
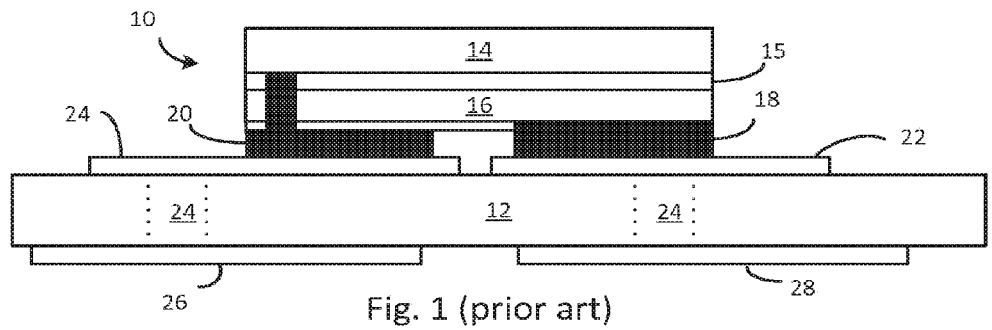
FIG. 1 is a cross-sectional view of a prior art blue or UV flip-chip LED die, mounted on a submount.

Prior art FIG. 1 illustrates a conventional flip chip LED die 10 mounted on a portion of a submount wafer 12. In a flip-chip, both the n and p contacts are formed on the same side of the LED die.

In this disclosure, the term "submount wafer" is intended to mean a support for an array of LED dies, where electrical contacts on the wafer are bonded to electrodes on the LED dies, and the wafer is later singulated to form one or more LEDs on a single submount, where the submount has electrodes that are to be connected to a power supply.

The LED die 10 is formed of semiconductor epitaxial layers, including an n-layer 14, an active layer 15, and a p-layer 16, grown on a growth substrate, such as a sapphire substrate. The growth substrate has been removed in FIG. 1 by laser lift-off, etching, grinding, or by other techniques. In one example, the epitaxial layers are GaN based, and the active layer 15 emits blue light. LED dies that emit UV light are also applicable to the present invention.

A metal electrode 18 electrically contacts the p-layer 16, and a metal electrode 20 electrically contacts the n-layer 14. In one example, the electrodes 18 and 20 are gold pads that are ultrasonically welded to anode and cathode metal pads 22 and 24 on a ceramic submount wafer 12. The submount wafer 12 has conductive vias 24 leading to bottom metal pads 26 and 28 for bonding to a printed circuit board. Many LEDs are mounted on the submount wafer 12 and will be later singulated to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all incorporated herein by reference.

Figure 2:
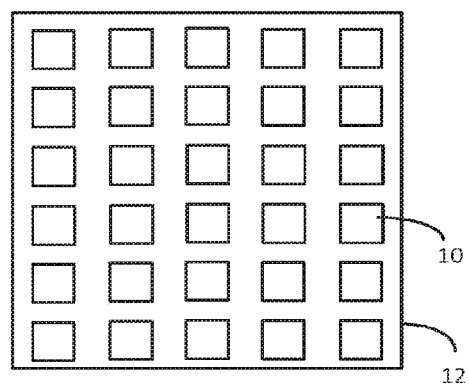
FIG. 2 is a top down view illustrating a simplified submount wafer populated by an array of LED dies, such as 500-4000 LEDs, where all LED dies on the wafer are simultaneously processed.

FIG. 2 is a simplified top down view of an exemplary submount wafer 12 on which is mounted an array of LED dies 10 (only one LED is numbered but all of the squares on wafer 12 are LEDs). There may be 500-4000 LEDs on a single submount wafer 12. All LEDs on the wafer 12 will be processed simultaneously using the method described below.

Figure 3:
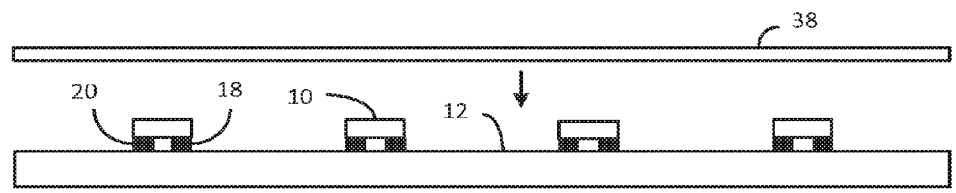
FIG. 3 illustrates the submount wafer of FIG. 2 having a phosphor layer being laminated or deposited over the LEDs.

FIG. 3 illustrates a portion of the submount wafer 12 having LED dies 10 mounted thereon. The LED electrodes 18 and 20 are bonded to metal pads on the submount wafer 12 that are connected to more robust pads on the bottom surface of the wafer 12 by vias extending through the wafer 12. When the wafer 12 is later singulated, the bottom pads may be soldered to pads on a printed circuit board.

A phosphor layer 38 is shown over the wafer 12, which represents that either the phosphor layer 38 will be laminated over the wafer 12 or that the phosphor layer 38 will be a remote layer separated from the LED dies 10. In another embodiment, the phosphor layer 38 may be singulated to form tiles, and each tile is affixed over an LED die 10. Further, in another embodiment, the phosphor layer 38 is laminated over an LED wafer prior to the LEDs being singulated. In that way, there is little waste of phosphor. Other uses of the phosphor layer 38 are envisioned.

Figure 4:
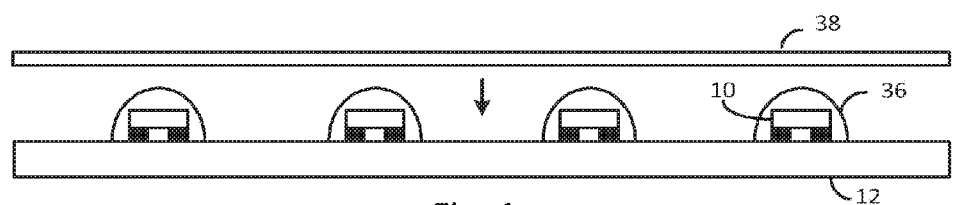
FIG. 4 illustrates the submount wafer of FIG. 2, populated with LEDs encapsulated with a lens, having a phosphor layer being laminated or deposited over the lenses.

FIG. 4 illustrates how the LED dies 10 may have a hemispherical lenses 36 molded over them to separate the phosphor layer 38 from the dies 10 after lamination. This reduces the intensity of heat and flux on the phosphor and improves color uniformity vs. angle.

Figure 5:
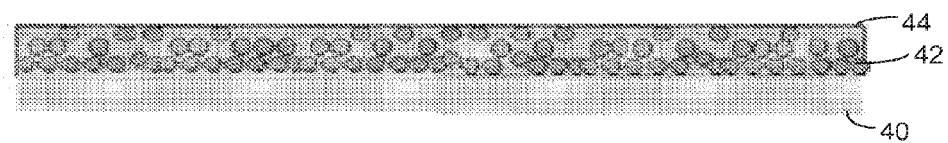
FIG. 5 is a cross-sectional view of the phosphor layer deposited on a substrate, where phosphor powder is distributed in a polymer binder. The substrate may be a glass substrate or the LED dies on the submount wafer.
Figure 6:
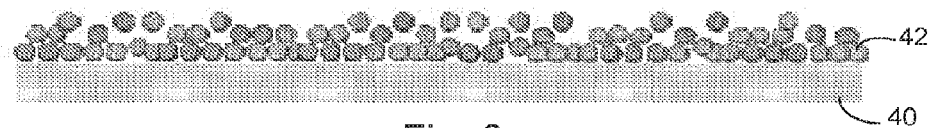
FIG. 6 illustrates the phosphor layer of FIG. 5 after the polymer binder has evaporated by oxidation in an O2 plasma or baked out in air, leaving a porous phosphor layer.
Figure 7:
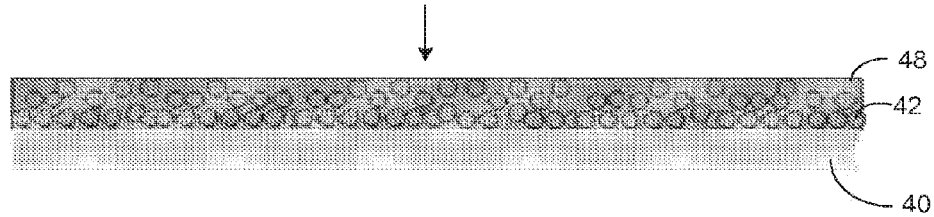
FIG. 7 illustrates a sol-gel glass, liquid glass, or other suitable transparent inorganic binder material saturating the porous phosphor layer, then being cured to form a robust inorganic binder.

FIGS. 5-7 illustrate the formation of a phosphor layer in accordance with one embodiment of the invention.

In FIG. 5, a substrate 40 may be a transparent glass plate, or the surface of the submount wafer 12 populated with the LED dies 10, or any other suitable substrate. If the phosphor layer 38 (FIGS. 3 and 4) is intended to be a self-supporting layer for a remote phosphor application, or is intended to be singulated as tiles and affixed on LED dies 10, then a glass substrate is preferred. A remote phosphor, supported by a transparent glass plate and separated from the LED(s), may be preferred for high power applications using an array of interconnected LEDs, where the light and heat generated are very high, or in situations where the emitted color is desired to be selectable by selecting to use one of a variety of remote phosphor plates having different characteristics. If the phosphor layer 38 is intended to be laminated directly over the LEDs on submount wafer 12 or over an LED wafer, then the substrate 40 would be the submount wafer 12 populated with the LED dies 10 or an LED wafer.

Initially, phosphor powder 42 is mixed with an organic polymer binder 44, such as an acrylate, nitrocellulose, or other commercially available binder that can be later evaporated or dissolved away. Due to the conventional small grain size of the phosphor powder 42 and its density in the binder 44, the distribution of phosphor powder 42 in binder 44 is fairly homogenous which should achieve good color uniformity across the phosphor layer 38. The phosphor grain size and density is not critical; however, the density should be such that the grains contact each other after the binder 44 is later removed.

The phosphor powder 42 may be any conventional phosphor, including YAG, red, green, yellow, blue, or orange phosphor, or combinations thereof, depending on the application and the LED.

Since the polymer binder 44 does not have to have good optical properties, it may be much less expensive than silicone. Silicone for use with phosphors is about $900 US/kg.

The mixed binder/phosphor may form a paste or viscous liquid that is spray coated, dip coated, spun on, or screen printed onto the substrate 40. The thickness is not critical for the invention, but the thickness and density of the phosphor powder 42 affects the emitted light color. The deposited layer should have a thickness accuracy of +/-2% to achieve good color uniformity.

In FIG. 6, the binder 44 is subjected to heat, such as 180-300 degrees C. in an air environment for a time to evaporate the binder 44. Alternatively, an O2 plasma may be used to oxidize the binder 40 to convert the binder 44 to a gas, or the binder may be chemically dissolved and heated.

The combination of heat and the removal of the binder 44 results in the phosphor powder 42 grains being sintered together and to the substrate 40 to form a relatively uniform layer of phosphor powder 42. The phosphor powder 42 forms a porous layer or a web.

In FIG. 7, the porous layer is then impregnated and saturated with a sol-gel (for forming a glass) or liquid glass, also known as water glass. This may be done by spray coating, dip coating, or other well-known method.

After the saturation step, the liquid glass or sol-gel is cured to dehydrate the material, leaving a robust glass binder 48 surrounding the phosphor powder 42. In some cases, curing is performed by heat or dehydrating at a longer time at room temperature, or performed using a chemical curing agent.

Liquid glass (sodium silicate or potassium silicate) is made by fusing varying portions of sand ($SiO_2$) and soda ash ($Na_2CO_3$), where $CO_2$ is driven off. The ratio of these portions determines the properties of the final product. This product is specified as a ratio of $SiO_2/Na_2O$ and as a concentration in water. The sodium may also be replaced by potassium or lithium in order to obtain different properties. After applying liquid glass as a thin film, the water is evaporated, leaving a solid glass coating behind. Lower $SiO_2/Na_2O$ ratios tend to retain water better and hence evaporate slower. Higher ratio solutions (approx. 2.8-3.22) are preferred if increased durability is desired. Complete dehydration typically requires heat during the drying process. The silicate layers may be cured at a temperature of 250° C., which is well below the temperature that luminescent materials can stand (nitride-based luminescent materials can stand temperatures up to 350° C. and YAG-based luminescent materials even much higher).

Another method to make the coatings durable is to make use of chemical setting. Chemical setting agents that can be used in this manner include mineral and organic acids, $CO_2$ gas, and acid salts such as sodium bicarbonate.

When silicate films are completely dehydrated, they provide excellent resistance to high temperatures. Most silicates have flow points around 850° C. In LEDs, such temperatures will never be reached.

Liquid glass is transparent for visible light, and the transmission drops off rapidly below 400 nm, exhibiting a value of approximately 40% at 325 nm. For LEDs that convert blue to white light, this range is sufficient.

Silicate coatings may be brittle. If a higher degree of flexibility is required, typically 5% by weight of glycerine can be added. Glycerine has a very high transparency for blue light. Other materials may be added, such as ethyelene glycol, propylene glycol, an alcohol, etc.

There are many suitable sol-gel materials, such as TEOS (tetraethylorthosilicate), MTMS (methyltrimethoxysilane), and MTES (triethoxysilane), all generally referred to as glass materials. Sol-gel is relatively inexpensive (less than $20 US/kg), so the resulting phosphor layer is less expensive than phosphor powder in a silicone binder. Glass has high thermo and photo-thermal stability and resists yellowing in the presence of the high heat and flux of an LED. Forming a sol-gel of such materials is well known for depositing the materials on a substrate.

The sol-gel process is a wet-chemical technique commonly used for the fabrication of a glassy coating. In this process, the sol (or solution) evolves gradually towards the formation of a gel-like network containing both a liquid phase and a solid phase. The micron-size or sub-micron-size glass particles become linked, forming the gel. The formation of a TEOS, MTMS, MTES, or other glass layer using sol-gel is well-known and need not be described in detail.

The drying process serves to remove the liquid phase from the gel, yielding an amorphous glass (a linked silica network or matrix). Subsequent thermal treatment (firing) may be performed in order to densify the glass to enhance its mechanical properties.

Since there will be shrinkage after dehydration, the thickness of the sol-gel or liquid glass should be adjusted to ensure complete coverage of the phosphor powder 42 after dehydration. Multiple applications and curing of the sol-gel or liquid glass may be desirable for complete coverage.

The glass layer may be formed to have a relatively high index of refraction, comparable to that of high index silicones, to provide good light extraction.

Figure 8:
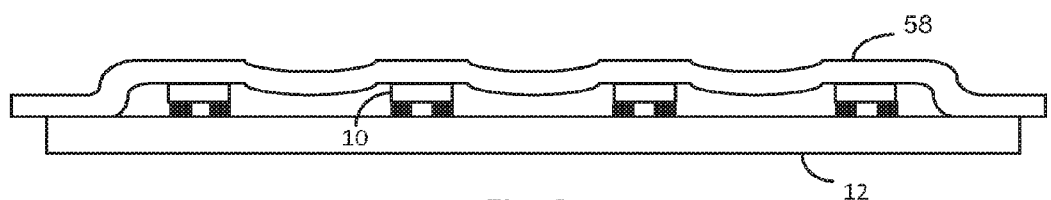
FIG. 8 illustrates the phosphor layer of FIG. 5 being laminated over a submount wafer populated with LED dies.
Figure 9:
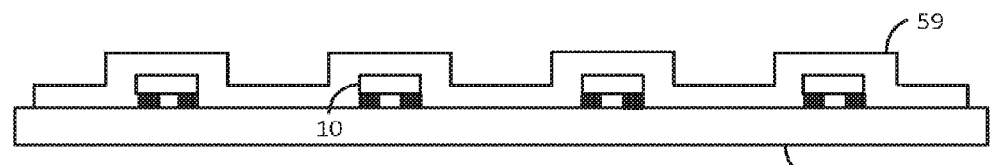
FIG. 9 illustrates the phosphor layer of FIG. 8 conforming to the shape of the LED dies upon application of a vacuum or other form of pressure.

As an alternative to depositing the film of FIG. 5 directly over the LED dies 10 or depositing the film on a glass substrate, the film may be pre-formed as a flexible layer then laminated over the LED dies 10 and submount wafer 12, as shown in FIGS. 8 and 9.

In one embodiment, a flexible layer of the polymer binder 44 and phosphor power 42 mixture is formed on a releasable film (an embodiment of substrate 40). The layer may be tested to determine its luminescent properties and matched to a particular bin of LED dies that emit a particular narrow range of blue light. As shown in FIG. 8, the flexible layer 58 is then laminated on the matched LED dies 10 with the releasable film facing up. A vacuum or mechanical downward pressure is used to ensure there are no air gaps and to conform the layer 58 to the LED dies 10. The releasable film is removed before or after the layer 58 is fully laminated over the LED dies 10. Then, as shown in FIG. 9, the processes of FIGS. 6 and 7 are performed to create a robust inorganic glass layer 59 containing the phosphor powder 42.

Figure 10:
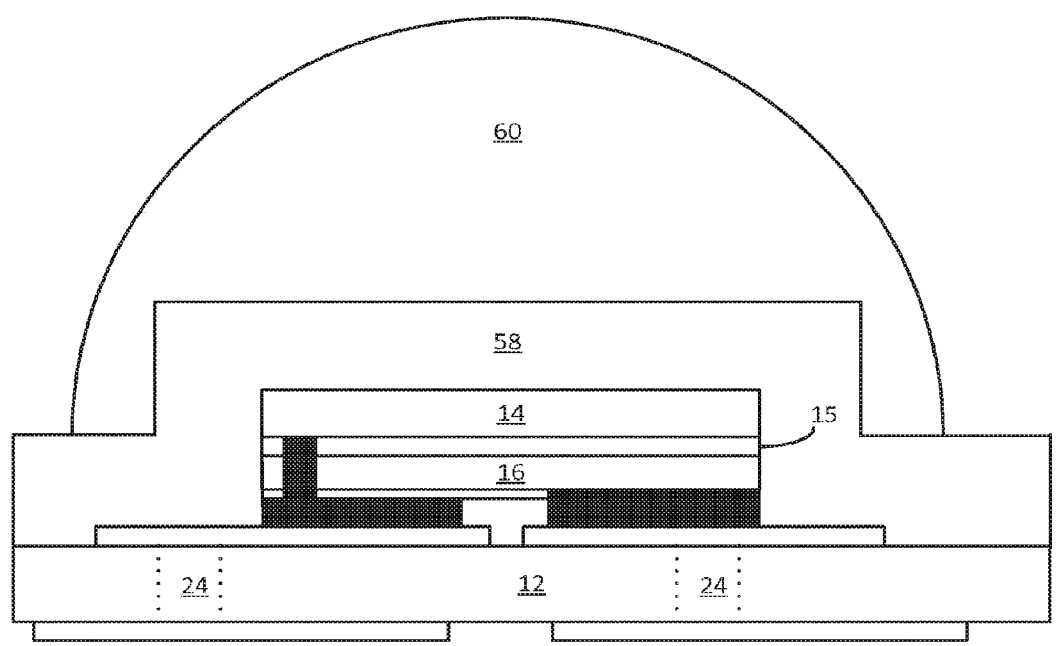
FIG. 10 is a cross-sectional view of a completed LED having a phosphor layer over it formed in accordance with one embodiment of the present invention, where the phosphor layer is formed over the entire surface of the submount wafer prior to singulation.

FIG. 10 illustrates the structure of FIG. 9 (using a laminated layer 58) after hemispherical lenses 60 are molded over the LED dies 10 and after the submount wafer 12 is singulated. The structure may emit white light or any color of light. The structure of FIG. 10 may also be formed by depositing the layer 44/42 of FIG. 5 directly over the LED dies 10 by spray coating, spin coating, etc., then performing the processes of FIGS. 6 and 7.

Figure 11:
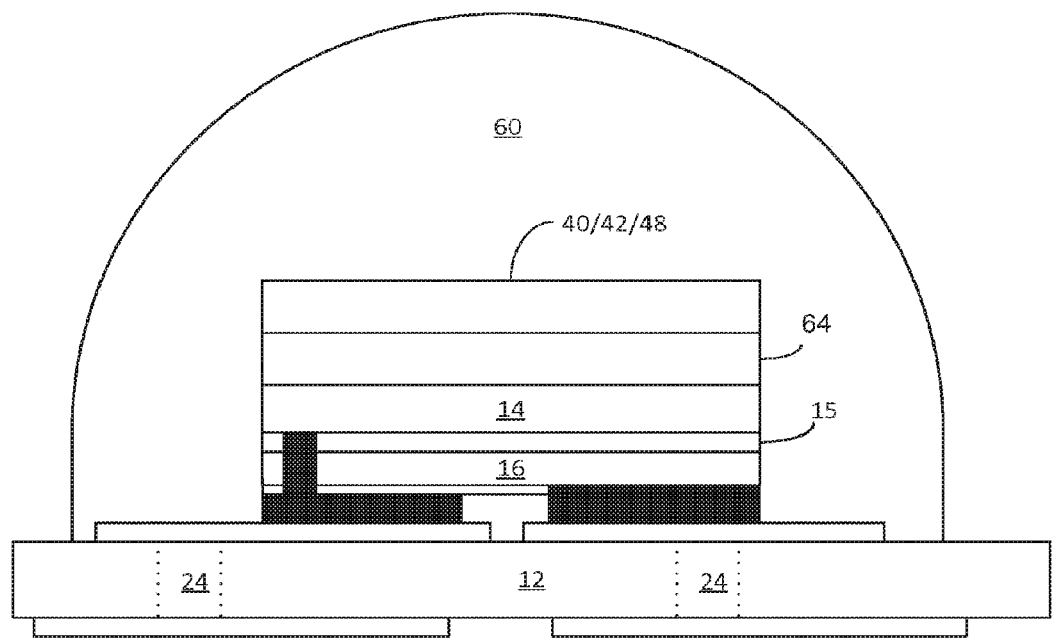
FIG. 11 is a cross-sectional view of a completed LED having a phosphor layer over it formed in accordance with another embodiment of the present invention, where the phosphor layer is affixed as a tile over the top of an LED die.

FIG. 11 illustrates an LED structure where the luminescent structure of FIG. 7 has been singulated to form luminescent tiles 40/42/48, and each tile is affixed over an LED die. In one embodiment, the LED die has a YAG tile 64 affixed directly over the top surface of the die, and a luminescent tile 40/42/48 containing red phosphor powder, formed using the processes of FIGS. 5-7, is affixed over the YAG tile 64 to create a warmer white light. A thin glass layer, epoxy, or silicone may be used as the adhesive.

Figure 12:
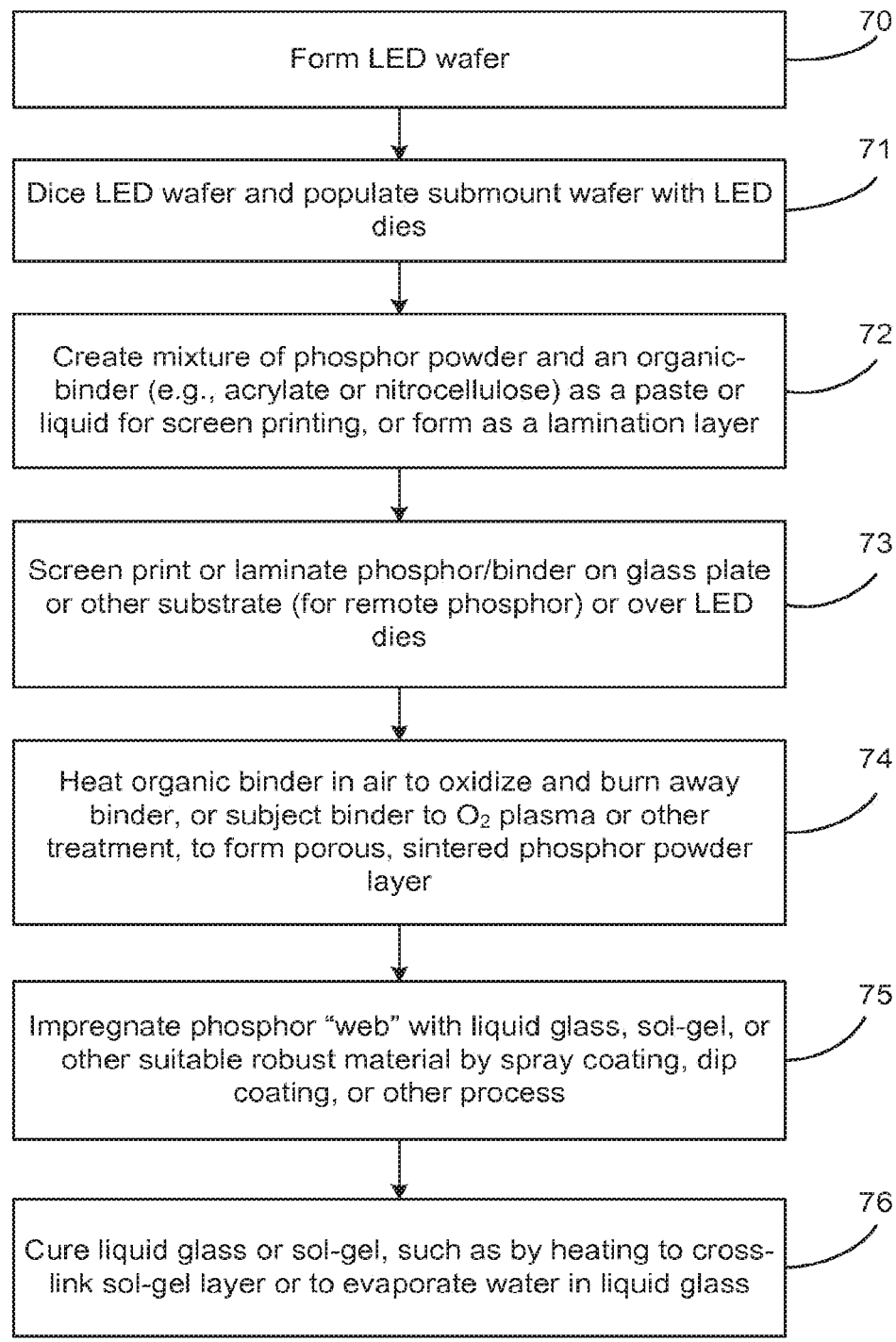
FIG. 12 is a flowchart summarizing techniques for fabricating the phosphor layer in accordance with some embodiments of the invention.

FIG. 12 is a flowchart summarizing various steps for forming the phosphor layer in accordance with some embodiments of the invention.

In step 70, an LED wafer is fabricated, such as a wafer containing GaN-based blue LEDs.

In step 71, the LED wafer is diced, and a submount wafer is populated with the LED dies.

In step 72, a mixture of phosphor powder and an organic binder is created as a paste or a liquid for screen printing or other type of deposition, or created as a lamination layer.

In step 73, the phosphor/binder mixture is printed or laminated on a glass plate (e.g., for a remote phosphor) or other substrate or over the LED dies.

In step 74, the organic binder is removed by heating or subjecting the binder to an $O_2$ plasma or other treatment, leaving a porous, sintered phosphor powder layer.

In step 75, the phosphor "web" is impregnated with liquid glass, a sol-gel, or other suitable material by spray coating, dip coating, or other process.

In step 76, the liquid glass or sol-gel is cured such as by heating to cross-link the sol-gel layer and/or evaporate any solution, such as water in the liquid glass.

Steps 75 and 76 may be performed multiple times due to shrinkage.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a luminescent structure comprising:
   a. depositing phosphor layer on a surface, the phosphor layer comprising phosphor powder mixed with a first binder;
   b. removing the first binder and heating the phosphor layer, leaving a porous phosphor layer on the surface comprising phosphor grains sintered together;
   c. infusing the porous phosphor layer with a sol-gel or liquid glass; and
   d. curing the sol-gel or liquid glass to form an inorganic transparent glass binder.

2. The method of claim 1 wherein the step of removing the first binder comprises heating the first binder to evaporate the first binder.

3. The method of claim 1 wherein the first binder comprises nitrocellulose.

4. The method of claim 1 where the step of depositing the phosphor layer comprises depositing the phosphor powder and first binder on a transparent support substrate, the method further comprising singulating the transparent support structure to form luminescent tiles and affixing one of the tiles over a light emitting diode (LED) die.

5. The method of claim 4 wherein affixing one of the tiles over the LED die comprises affixing one of the tiles over another phosphor tile affixed over the LED die.

6. The method of claim 1 wherein the sol-gel or liquid glass, after curing, forms a layer of inorganic glass.

7. The method of claim 1 wherein the sol-gel or liquid glass, after curing, forms a layer of either TEOS, MTMS, or MTES.

8. The method of claim 1 where the step of depositing the phosphor layer comprises depositing the phosphor powder and first binder on a transparent support substrate, wherein the support structure is a transparent lens between a light emitting diode die and the phosphor layer.

9. The method of claim 1 wherein the step of depositing the phosphor layer comprises depositing the phosphor layer over a light emitting diode die.

10. The method of claim 1 where the step of depositing the phosphor layer comprises depositing the phosphor powder and first binder on a transparent support substrate, the method further comprising positioning the porous phosphor layer, infused with the glass binder, and the support structure over a light emitting diode (LED) die so the phosphor layer is not in direct contact with the LED die.

* * * * *